United States Patent
Schreiber et al.

(10) Patent No.: US 6,313,402 B1
(45) Date of Patent: *Nov. 6, 2001

(54) STRESS RELIEF BEND USEFUL IN AN INTEGRATED CIRCUIT REDISTRIBUTION PATCH

(75) Inventors: Chris M. Schreiber, Lake Elsinore; Bao Le, Santa Ana; Eric Dean Jensen, Irvine, all of CA (US)

(73) Assignee: Packard Hughes Interconnect Company, Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/959,837

(22) Filed: Oct. 29, 1997

(51) Int. Cl.[7] .................................................. H01L 23/02
(52) U.S. Cl. .................... 174/52.4; 257/669; 257/674; 257/690; 257/692
(58) Field of Search ........................... 174/254, 52.2, 174/52.4; 257/674, 676, 688, 669, 690, 692; 361/773, 749, 750, 776

(56) References Cited

U.S. PATENT DOCUMENTS

| 4,640,499 | * | 2/1987 | Hemler et al. | 267/160 |
| 5,166,774 | * | 11/1992 | Banerji et al. | 361/749 |
| 5,207,887 | | 5/1993 | Crumly et al. | 205/78 |
| 5,250,843 | * | 10/1993 | Eichelberger | 257/692 |
| 5,469,333 | * | 11/1995 | Ellerson et al. | 361/799 |

* cited by examiner

Primary Examiner—Dean A. Reichard
Assistant Examiner—Hung V Ngo
(74) Attorney, Agent, or Firm—Thomas N. Twomey

(57) ABSTRACT

A metallic or an electrical trace having a terminus and a stress relief bend formed in the trace adjacent the terminus. The electrical trace may have a portion carried by a flexible substrate to form a flexible circuit. The stress relief bend may be free floating and extend from the flexible substrate or may be encapsulated by the flexible substrate. The electrical circuit and the flexible circuit each have a generally planar portion extending in the X and Y axis, with the stress relief bend projecting into the Z axis. This allows electrical traces to be spaced with a very narrow pitch because the stress relief bend does not consume any valuable real estate on the flexible circuit or the substrate to which the electrical trace is applied.

13 Claims, 4 Drawing Sheets

STRESS RELIEF BEND USEFUL IN AN INTEGRATED CIRCUIT REDISTRIBUTION PATCH

TECHNICAL FIELD

The invention relates to a metallic or an electrical lead terminus with a stress relief portion.

BACKGROUND OF THE INVENTION

A long standing problem known to those skilled in the electronics art involves the mismatch between the thermal properties of materials making up an electronic device and the materials making up the substrate to which the device is mounted. Canestaro et al U.S. Pat. No. 4,728,751 addressed the mismatch problem associated with mounting an electronic device, such as a semiconductor chip made primarily of silicon, directly onto an organic substrates, such as printed circuit boards made primarily of glass cloth impregnated with epoxy resin or other suitable materials. Canestaro et al solved the mismatch problem by processing a selected surface portion of a substrate to form a relatively low adhesive area surrounded by a relatively high adhesive area. A circuit line pattern was deposited on the substrate, including circuit lines having termini with stress relief bends located in the relatively low adhesive area on the surface of the substrate. As such, the terminus of each of the circuit lines floats on the surface of the substrate while the remainder of the circuit line is fixed to the relatively high adhesive area on the surface of the substrate. However, the circuit line including the relief bend are co-planar and parallel to the surface of the substrate. Consequently, the lines with the stress relief bend consume a substantial amount of real estate on the substrate.

Ashby, U.S. Pat. No. 3,519,890 also attempted to solve the thermal mismatch problem by interconnecting a microelectronic circuit containing die with a substrate utilizing a meandering conductive line to relieve the stress on the die and conductive line under thermal conditions and temperature cycling. However, the meandering lines did not have a common geometry and as a result took up a substantial amount of valuable area on the mounting substrate.

The present invention provides alternatives to and advantages over the prior art.

SUMMARY OF THE INVENTION

The invention includes a metallic or an electrical trace having a terminus and a stress relief bend formed in the trace adjacent the terminus. The stress relief bend is a shaped geometry that has an increased length to distribute strain. The geometry of the bend has the effect of changing the overall elasticity of the trace section (compared to linear sections) thereby limiting strain. The electrical trace may have a portion carried by a flexible substrate to form a flexible circuit. The stress relief bend may be free floating and may extend from the flexible substrate or may be encapsulated by the flexible substrate or other material. The electrical trace and the flexible substrate each have a generally planar portion (extending in the X and Y axis), with the stress relief bend projecting from the plane (along the Z axis). This allows traces to be spaced with a very narrow pitch because the stress relief bend does not take up any valuable real estate on the flexible circuit or the substrate to which the trace is applied.

In a preferred embodiment, the invention includes an integrated circuit redistribution patch including an electrical trace having a terminus and a stress relief bend adjacent the terminus. The flexible circuit includes raised electrical contact features in addition to those utilized to make the termination to the integrated circuit chip. The additional raised electrical contact features allow for electrical connection to input and output (I/O) termination pads on the periphery of the integrated circuit and a higher interconnection site capable of distributing stress.

DESCRIPTION OF THE PREFERRED EMBODIMENT

Figure 1:
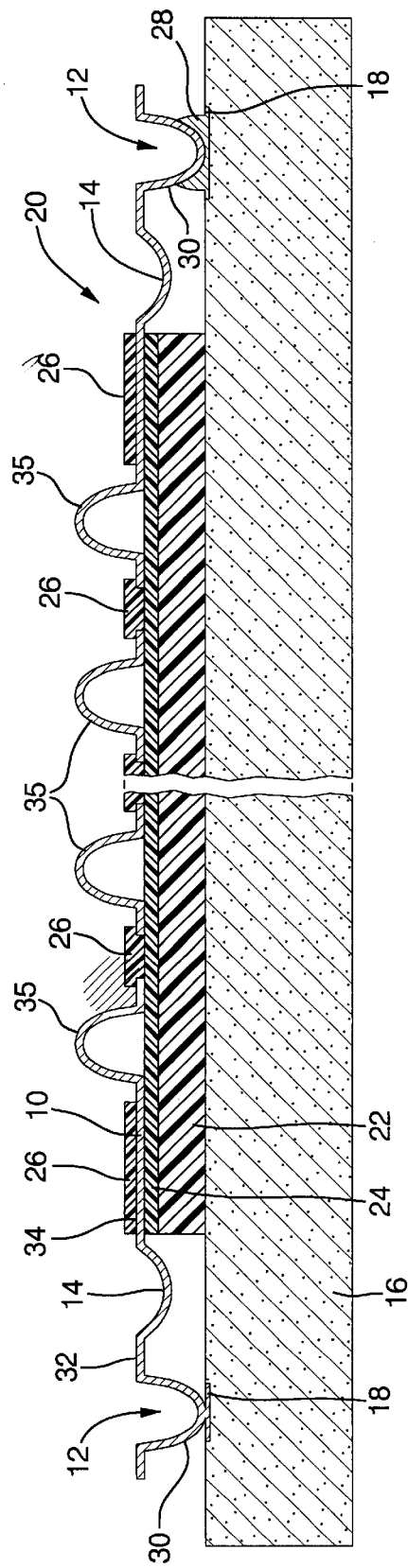
FIG. 1 illustrates a redistribution patch including a stress relief bend according to the present invention.

FIG. 1 illustrates a metallic or an electrical trace 10 having a terminus 12 and a stress relief bend 14 according to the present invention. In the embodiment shown in FIG. 1, the electrical trace 10 with stress relief bend 14 is utilized in an integrated circuit redistribution patch. The patch is used to redistribute, or fan in, peripheral input/output leads over the face of the integrated circuit chip. The combination includes an integrated circuit chip 16 having a contact pad 18 formed on an upper surface thereof. A flexible circuit 20 is positioned over the integrated circuit chip 16 with a compliant layer or an elastomer pad 22 interposed between the chip 16 and flexible circuit 20. The flexible circuit 20 includes a lower and upper insulation layer 24, 26 selectively deposited to encapsulated or expose various portions of the electrical trace. The insulation layers 24, 26 may be a dielectric such as a polyimide. The terminus 12 of the electrical trace may be flat but preferably is a raised feature 30 and is sonic welded, soldered 28 or attached by an electrically conductive adhesive to a contact pad 18 on the integrated circuit chip. More preferably, the raised feature 30 has a conical shape. The raised feature 30 may be utilized to make electrical contact to an electrical components such as an integrated circuit chip or the raised feature may be utilized to make thermal contact to a heat generating component.

Figure 2:
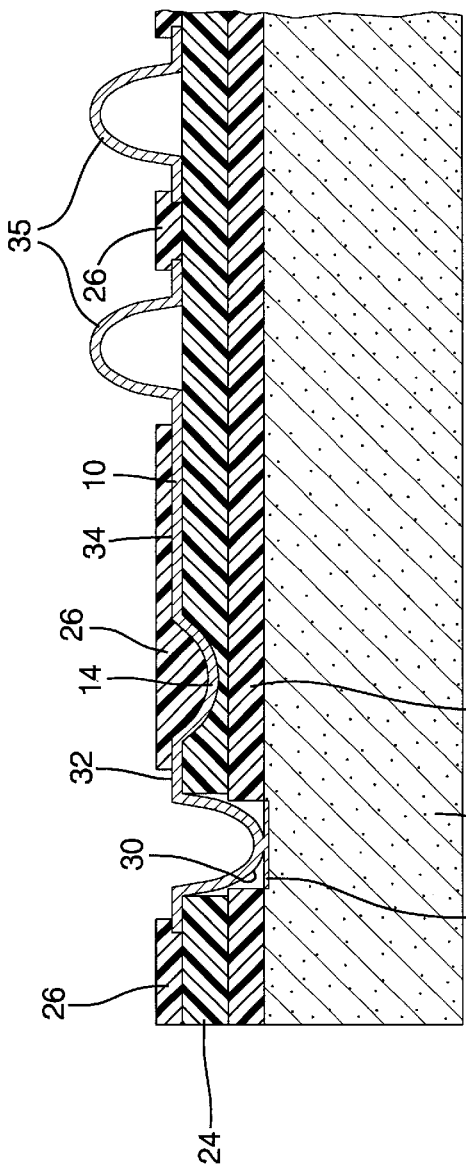
FIG. 2 is an enlarged view of a redistribution patch including a stress relief bend that has been encapsulated by a dielectric material according to the present invention.

The stress relief bend 14 is formed in the trace adjacent to the raised feature 30. Preferably, the stress relief bend 14 is surrounded by a first and second substantially planar portion 32, 34 of the electrical trace. The stress relief bend 14 may be free floating when extended outwardly from the insulation layers 24, 26 as illustrated in FIG. 1. Alternatively, the stress relief bend 14 may be encapsulated by the insulation layers 24, 26 as illustrated in FIG. 2. The electrical trace may include a second raised feature 35 extending in an opposite direction to that of the first raised feature 30 (terminus) for making contact to the base substrate. Preferably the first raised feature 30, stress relief bend 14, and second raised feature 35 are all apart of a metallic trace which includes a continuous layer of conductive material such as copper formed by a mandrel process to be described hereafter. The elastomer pad or compliant layer 22 prevents damage to the second raised feature 35 or accommodates surface irregularities when the second raised features engage another component such as a test socket or surface mount solder interconnection on a multilayer printed wiring board.

As will be appreciated from FIG. 1, the electrical trace 10 and flat flexible circuit 20 each have a generally planar portion including portion 32, 34 with the stress relief bend 14 extending from the plane. Thus, the stress relief bend 14 does not take up any valuable real estate on the flexible circuit or the substrate to which the trace is applied. The term stress relief bend as used herein includes a shaped geometry that has an increased length to distribute strain. The geometry has the effect of change the overall elasticity of the trace section (compared to linear sections) thereby limiting strain. The bend is nonlinear having a portion extending out of the plane that is at least U-shaped, V-shaped, or has a configuration, or any other configuration which relieves stress on the electrical trace and the sonic weld or solder used to secure the terminus to an electrical component or heat generating component during operation or thermal cycling.

An electrical trace having raised features 30, 35 and stress relief bends 14 may be manufactured by a variety of methods including mechanically forming conical shaped raised features and stress relief bends using a tool forced into a flat conductive trace. Preferably, the electrical trace is formed using a mandrel method similar to that disclosed in Crumly at al U.S. Pat. No. 5,207,887 the disclosure of which is hereby incorporated by reference.

Figure 3A:
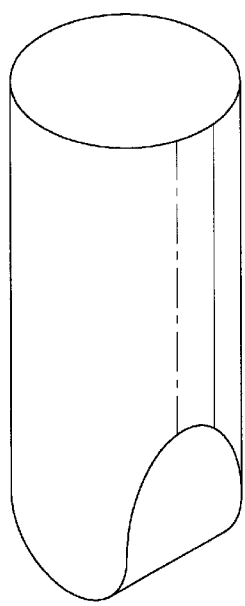
FIGS. 3A–3D illustrate tools for forming dimples and dents in a mandrel to make a metallic trace having raised features and stress relief bends according to the present invention.
Figure 3B:
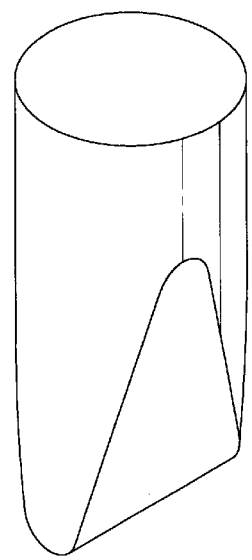
Figure 3C:
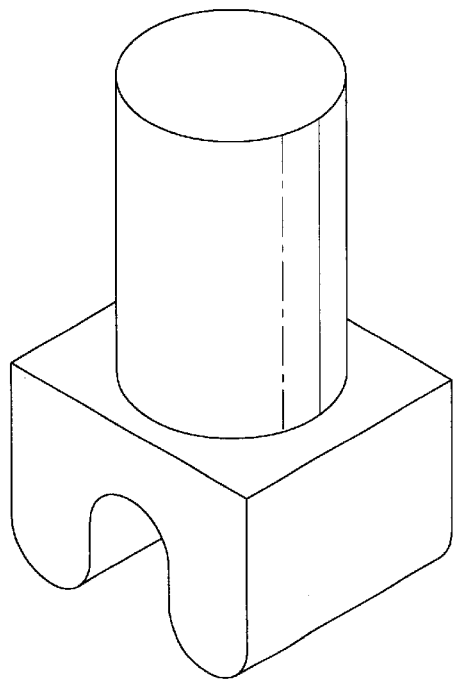
Figure 3D:
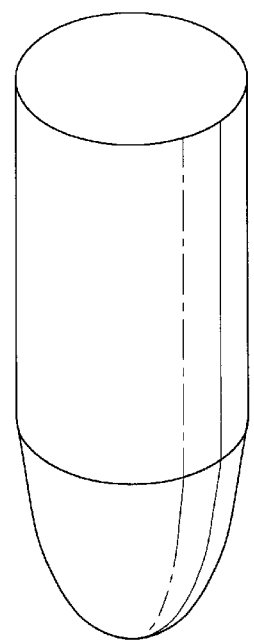
Figure 4:
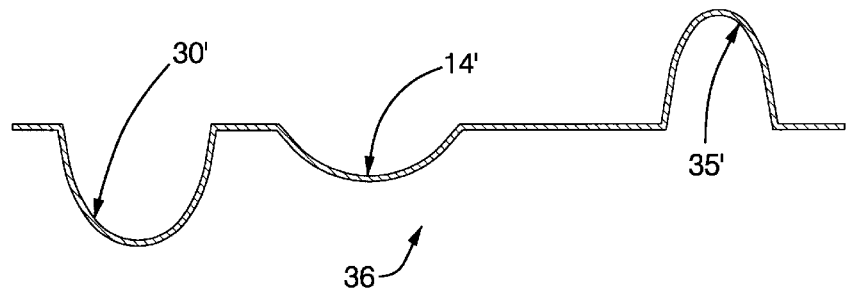
FIG. 4 illustrates a mandrel for making a metallic trace having raised features and stress relief bends according to the present invention.

According to the present invention, a mandrel for making flexible circuits is fabricated from a stainless steel shim or foil stock. FIG. 3A illustrates a tool for making a U-shaped dent (having a relatively large radius) in the foil stock corresponding to a stress relief bend 14 in the electrical trace. Likewise, FIG. 3B illustrates a tool for making a V-shaped dent (having a relatively narrow radius) in the foil stock corresponding to a different shaped stress relief bend 14 in the electrical trace. FIG. 3C illustrates a tool for making a multiple wave in the mandrel corresponding to a stress relief bend. FIG. 3D illustrates a tool for making conical shaped or hemispherical dimples in the foil stock corresponding to conical shaped or hemispherical raised electrical contact features 30, 35 in the electrical trace. Utilizing the above described tools, dimples 30' and dents 14' are formed in a first face of the shim stock corresponding to the first raised feature 30 and bend 14 by placing a second face of the stock on an adhesive layer overlying a piece of soft metal, not shown, such as aluminum and forcing the above described tools into the stock and underlying soft metal or other suitable substrate. The thickness of the shim or foil stock is chosen so that when the first face is dimpled or dented, the second face is deformed so that bumps or protrusions 35' are formed extending out of the second face corresponding to the second raised feature 35. Inwardly facing dimple is formed by turning the shim stock over and dimpling the second face in a similar manner. As such, a dimple is formed in the second face and a bumps extending upwardly from the first face of the foil stock. This allows for the raised electrical contact features 30, 35 to be formed so as to extend outwardly from the faces of the flexible circuit in opposite directions, as illustrated in FIGS. 1–2. The adhesive layers are thereafter removed by dissolving with an aqueous solvent to provide a formed mandrel 36 as illustrated in FIG. 4.

Figure 5:
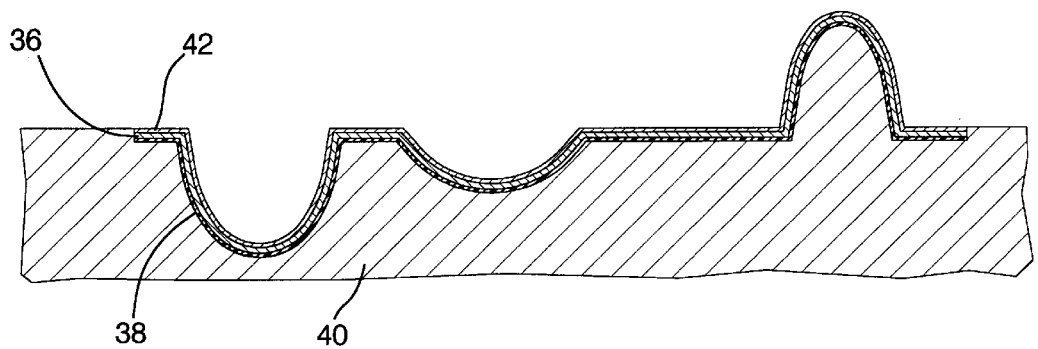
FIGS. 5–9 illustrate a process for making a metallic trace having raised features and stress relief bends and carried by a flexible substrate according to the present invention.

The shim stock typically is from 2–4 mils thick and can be flash plated with copper and circuit constructed thereupon in a manner to be described hereafter. The transfer cover has to have a hole to clear the upwardly facing bumps and/or protrusions. The downwardly extending bumps or protrusions will be slightly larger than the tool dimensions. Once the outwardly facing bumps and protrusions are formed, a layer of adhesive 38 is applied to the shim stock laminated onto a convenient substrate 40 such as a polyimide fiberglass board or a flexible substrate such as polyimide to form a more suitable size mandrel, as illustrated in FIG. 5. The inwardly extending bumps and protrusions push into the substrate 40 and at least a portion of the depressions in the second face is filled with the heated substrate material. However, due to the strength of the foil there is no need to back fill the depressions. The substrate material may be laminated at temperatures ranging from 375 to 400 degrees F and at pressures of 275 to 325 psi.

As illustrated in FIG. 5, the mandrel 36 including the dimples, dents and bumps is then coated with a copper coating 42, typically referred to as flash plated, which covers the entire surface of the mandrel. The flash plated copper 42 is applied by electroplating or other known techniques. The thin conductive coating presents the adhesive that will be used to laminate the circuit from adhering to the mandrel surface. Flash plating is a conventional electrolytic plating formed in a very short or momentary operation so that for only a series thin plating coat is provided. The flash plated coat is very thin compared to the thickness of the electrical circuit traces that are to be made. For example, for a circuit trace of 1½ mil thickness, a flash plating of copper on the mandrel will have a thickness of 0.01 to 0.02 mils. The thin flash plate 42 is employed because it can be relatively easily released from the stainless steel mandrel 36 and can be removed from the lamination after separation from the mandrel by flash etching. Obviously, other methods of coating the mandrel with a thin coat of conductive material that is easily separated from the mandrel and from the completed circuit traces may be employed in the place of the electrolytic flash plating.

Flash plated copper 42 is then coated with a photoresist 44, which is then optically exposed through a mask defined defining a pattern of the desired circuit and developed. The photoresist that has not been polymerized is then removed to leave the partially completed flash plated copper 42 coating now bears a pattern of photoresist 44 that is a negative pattern of the circuit trace pattern to be fabricated with the mandrel.

Figure 6:
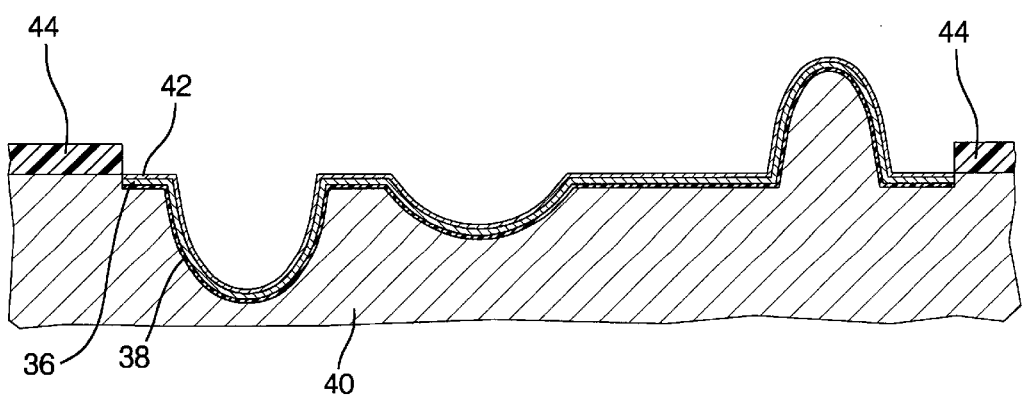
Figure 7:
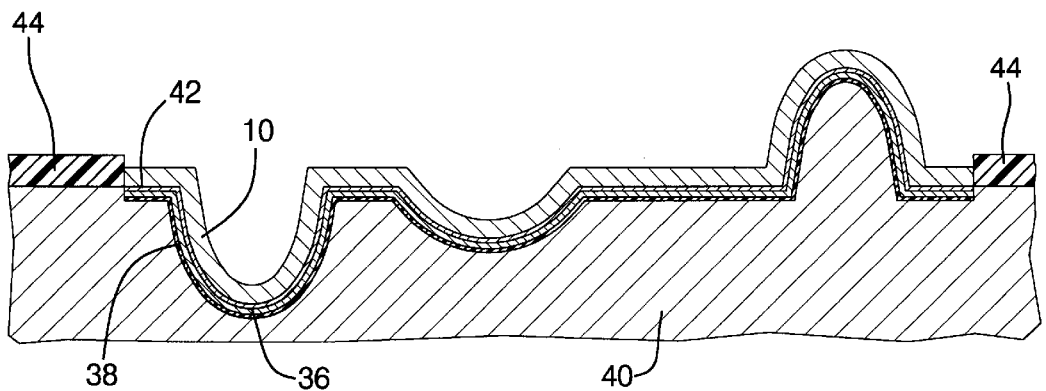

The mandrel assembly of FIG. 6 is then subjected to a suitable additive electroforming process, to plate up copper traces 10 over the shim bump and into the shim dimples and dents as shown in FIG. 7. The copper traces 10 are plated directly onto those portions of the flash plated copper 42 coating that are not covered by the negative pattern of the developed photoresist 44. Thus the plating process simultaneously forms both the circuit traces and the raised electrical contact features 30, 35 and stress relief bend 14.

Figure 8:
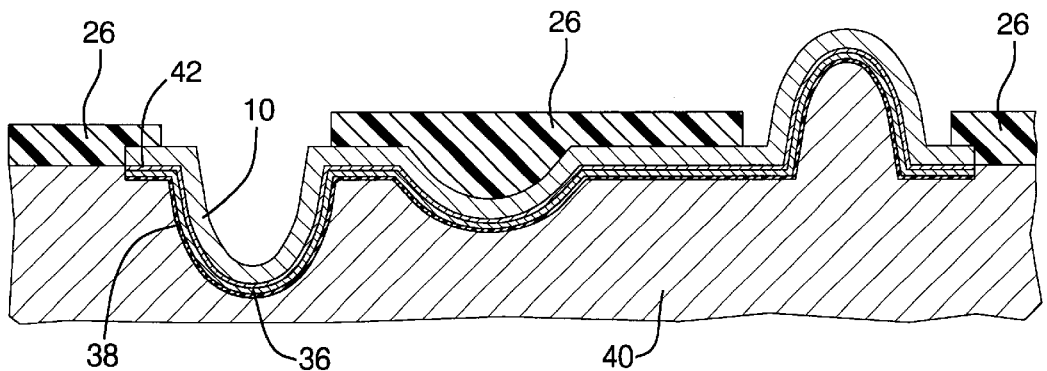

The photoresist 44 is then stripped to leave the circuit traces and the flexible raised electrical contact features on the flash plated copper coating which is still on the mandrel as shown in FIG. 8. The flexible circuit raised electrical contact features are partially hollow having a depression on an under side corresponding to the generally conical shaped of the raised feature. If deemed necessary or desirable, the depression formed in the electroplating raised feature may be filled with a solid material such as an epoxy. The depression may also be filled with the adhesive used to adhere the dielectric layer described hereafter. Now a layer of suitable dielectric 26 and adhesive, such as, a layer of Kapton™, available from DuPont, and adhesive are laminated to the mandrel assembly with the traces and circuit features under suitable high temperatures and pressures. Only that side of the traces and pads that is directly in contact with the flash plated copper on the mandrel is not laminated by the adhesive/Kapton™ substrate. The assembly shown in FIG. 8, including the flash plated copper, traces, raised features, bend and the adhesive/Kapton™ substrate is removed from the mandrel.

Figure 9:
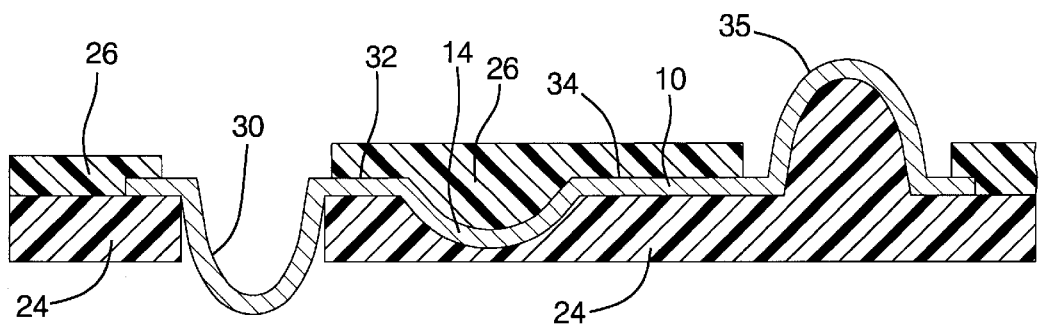

Then, as illustrated in FIG. 9, the flash plated copper coating which covers the entire lower surface of the assembly is removed by a flash etching process. Thereafter, a second dielectric layer 24 such as Kapton™ is applied to the other side of the electrical trace 10. Although the invention has been described heretofore as an electrical trace with a stress relief bend formed therein, the invention is applicable to a metal trace for making connection to a heat generating device and dissipating heat through the metal trace. Such metal traces are also soldered or sonic welded to the heat generating device and suffer from the same thermal mismatch problem.

What is claimed is:

1. A product comprising:
    a flexible circuit including a plurality of electrical traces having at least a portion encapsulated by an insulating material, at least one of said electrical traces having a portion secured to an electrical component, the at least one electrical trace having a substantially planar portion, a stress relief bend formed in the at least one electrical trace adjacent the secured portion and extending from the substantially planar portion, and a compressible layer interposed between the flexible circuit and the electrical component.

2. A product as set forth in claim 1 wherein the compressible layer comprises an elastomer material.

3. A product as set forth in claim 1 wherein the secured portion comprises a raised feature extending downwardly from the substantially planar portion.

4. A product as set forth in claim 3 when the raised feature comprises a conical or hemispherical shape.

5. A product as set forth in claim 1 wherein the secured portion is connected by a sonic weld, solder or an electrically conductive adhesive.

6. A product as set forth in claim 1 further comprising a sonic weld or solder or electrically conductive adhesive securing the secured portion and wherein the stress relief bend is operative to prevent damage to the electrical trace or the sonic weld, solder or electrically conductive adhesive.

7. A product as set forth in claim 1 wherein the insulating material comprises a flexible substrate, the substrate including a first face overlying the electrical component, and at least one of the electrical traces further comprising a raised feature extending upwardly from a second face of the substrate.

8. A product as set forth in claim 7 wherein the secured portion comprises a first raised feature.

9. A product as set forth in claim 1 wherein the secured portion and the stress relief bend are not encapsulated by the insulation material.

10. A product as set forth in claim 1 wherein the stress relief bend is encapsulation by the insulation material.

11. A product as set forth in claim 1 wherein the stress relief bend has a U-shaped configuration.

12. An integrated circuit chip redistribution patch comprising a flexible circuit including a plurality of electrical traces having portions selectively encapsulated by an insulation material, the insulation material having a first face for lying over an integrated circuit chip and a second opposed face, the insulation material having a substantially planar portion, at least one of the electrical traces comprising a terminus for securing to the integrated circuit chip and a stress relief bend adjacent the terminus and extending from the planar portion of the flexible circuit, the at least one electrical trace further comprising a first raised feature extending outwardly from the second opposed face of the insulation material.

13. An integrated circuit chip redistribution patch comprising a flexible circuit including a plurality of electrical traces having portions selectively encapsulated by an insulation material; the insulation material having first face for lying over an integrated circuit chip and a second opposed face, the insulation material having a substantially planar portion, at least in of the electrical traces comprising a terminus for securing to the integrated circuit chip and a stress relief bend adjacent the terminus and extending from the planar portion of the flexible circuit, the electrical trace further comprising a fist raised feature extending outwardly from the second opposed face of the insulation material, and
    the terminus comprising a second raised feature extending in an opposite direction to that of the first raised feature.

* * * * *